United States Patent [19]

Höfflinger et al.

[11] 4,186,383

[45] Jan. 29, 1980

[54] CHARGE WEIGHTING DIGITAL-TO-ANALOG CONVERTER

[76] Inventors: Bernd Höfflinger, No. 23, Gartenstrasse, 5841 Holzen; Jürgen Dahms, No. 30, Hirschweg, 4600 Dortmund-Berghofen, both of Fed. Rep. of Germany

[21] Appl. No.: 773,255

[22] Filed: Mar. 1, 1977

[30] Foreign Application Priority Data

Mar. 23, 1976 [DE] Fed. Rep. of Germany ....... 2612204

[51] Int. Cl.² .......................................... H03K 13/02
[52] U.S. Cl. ....................... 340/347 DA; 340/347 M
[58] Field of Search ................... 340/347 DA, 347 M

[56] References Cited

U.S. PATENT DOCUMENTS

| | | | |
|---|---|---|---|
| 3,594,782 | 7/1971 | Carbrey | 340/347 DA |
| 3,611,356 | 10/1971 | Jensen | 340/347 DA |
| 3,665,458 | 5/1972 | Mulkey et al. | 340/347 DA |
| 3,747,088 | 7/1973 | Pastoriza | 340/347 DA |
| 3,836,906 | 9/1974 | Ando et al. | 340/347 DA |
| 4,077,035 | 2/1978 | Yee | 340/347 DA |

FOREIGN PATENT DOCUMENTS 867394  5/1961  United Kingdom ................ 340/347 M

OTHER PUBLICATIONS

Mok et al., A Charge-Transfer-Device Logic Cell, Solid-State Electronics, vol. 17, 1974, pp. 1147–1154.
Suarez et al., All-MOS Charge Redistribution . . . , IEEE Journal of Solid State Circuits, vol. SC-10, No. 6, 12/1975, pp. 379–385.

Primary Examiner—Thomas J. Sloyan
Attorney, Agent, or Firm—John C. Smith, Jr.

[57] ABSTRACT

A digital-to-analog converter consisting of capacitors for a weighted charge distribution corresponding to the digits of an n-digit binary number that is to be converted to analog form comprises n weighted capacitors. These capacitors are integrated with charging switches for the n-digits of the binary number, discharging switches, charge distributing switches and a reference voltage source being also provided.

5 Claims, 3 Drawing Figures

DIGITAL-TO-ANALOG CONVERTER OF GROUP x-1

DIGITAL-TO-ANALOG CONVERTER OF GROUP x

CHARGE WEIGHTING DIGITAL-TO-ANALOG CONVERTER

BACKGROUND OF THE INVENTION

This invention relates to a digital-to-analog converter (D/A converter) consisting of capacitors for a weighted charge distribution corresponding to the digits of an n-digit binary number that is to be converted to analog form.

In systems for transmitting or processing information the input signals usually become available in analog form (pressure, temperature, voltage and so forth). An output signal in analog form is also mostly desired (control voltage). However, if the input signal is to be processed within a system in digital form for the purpose of excluding interference, then the input must include an analog-to-digital converter (A/D converter) and the output circuit a D/A converter. In view of the present requirement of large scale integration—the entire system being ideally integrated on a single semiconductor chip—it is essential for reasons of cost, power consumption and reliability to integrate these converters with the rest of the system. Only if this is done will the result be economically acceptable.

Three major considerations govern the design of networks integrated on a large scale:

The surface area needed for the implementation of the network should be a minimum.

The power consumption of the network should be a minimum.

The switching times should be as short as possible.

Particularly when D/A and A/D converters are incorporated in the integrated system the conversion time must match the signal processing time. The surface area required and the power consumption should generally be negligible compared with those of the remainder of the network. The surface area requirement should not exceed 10%. The principle disclosed in the published as-filed specification of German Patent Application Ser. No. 2,310,267 would not therefore be appropriate for the contemplated purpose.

In the case of a practicable effective semiconductor chip size of about 25 mm² the capacitors of such a 10-bit D/A converter would already occupy 4 mm². In other words, the D/A converter (transistors and capacitors) would take up 20% of the available overall surface.

SUMMARY OF THE INVENTION

It is the object of the present invention to avoid these shortcomings of the state of the art and to provide a D/A converter which is suitable for co-integration on a semiconductor chip.

To attain this object the present invention provides a D/A converter of the character described which comprises n weighted capacitors integrated with charging switches for the n digits of a binary number, discharging switches and charge distributing switches as well as a reference voltage source being also provided.

BRIEF DESCRIPTION OF THE DRAWINGS

In order that the nature of the invention may be better understood non-limiting embodiments thereof will now be more particularly described, purely by way of example, and reference will be made to the accompanying drawings in which.

DESCRIPTION OF THE PREFERRED EMBODIMENTS

Contrary to the above-described methods of D/A conversion the subject matter of the invention is an integrated D/A converter having the following characteristics:

It makes use of elements which can be precision produced at an acceptable cost, such as MOS capacitors.

It converts digital signals to analog signals at high speed by charge distribution between parallel binary weighted capacitors.

The component expenditure is substantially reduced by groupwise charge distribution for D/A conversion, enabling D/A converters of high resolving power to be integrated in the system. This only insignificantly prolongs the conversion time. The analog output signal is produced by capacitor combination particularly "C-16C" tapping.

For the total conversion of n-bits in m-groups only $2(m-1)+2$ cycles are needed.

Relative and absolute precision of the conversion can be optimized by minimizing the number of components.

For the construction of D/A converters, particularly of monolithically integrated converters, the precision of the elements must be weighed against the expense of producing them. It will be found that capacitors, particularly MOS capacitors of adequate precision can be produced at an acceptable cost so that their employment in integrated D/A converters is advantageous.

Figure 1:
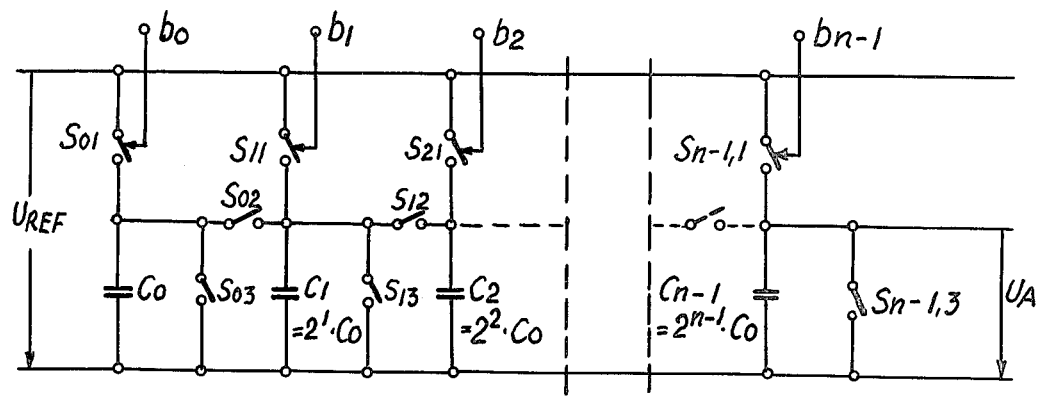
FIG. 1 is a D/A converter for n-digit binary numbers, according to the invention.

For the parallel D/A conversion by charge distribution the D/A converter comprises n binary weighted capacitors ($C_0, C_1, \ldots, C_{n-1}$), charging switches $S_{n1}$, discharging switches $S_{n3}$, and charge distributing switches $S_{n2}$ (cf. FIG. 1).

The manner in which this system functions is as follows:

First the capacitors are discharged by switches $S_{n3}$.

Then the switches $S_{n1}$ are either closed or they remain open according to the bit combination $b_0 \ldots b_{n-1}$ (e.g. $b_m=$"1" means "close switch" and $b_m=$"0" means "switch to remain open"). The capacitors are thus charged to their reference potential $U_{REF}$ or they remain without a charge.

At the end of the charging time all the switches $S_{n1}$ are opened and all the switches $S_{n2}$ are then closed. This results in equalization of all the charges. An output voltage $$U_A = \frac{\Sigma Q}{\Sigma C} = \frac{b_0 + 2b_1 + 4b_2 + \ldots + 2^{n-1}b_{n-1}}{2^n - 1} U_{REF}$$

is therefore obtained. The D/A conversion has been effected. Independently of the number of bits in a digital number three cycles are needed for each D/A conversion. The first two can be combined.

By groupwise D/A conversion in capacitive D/A converters according to the invention the n bits of the digital word (bytes) are divided into m groups:

$$(b_0, b_1, ..., b_{m-1}) = \underbrace{(b_{10}, b_{11}, ..., b_1(\frac{n}{m} - 1)}_{\text{Group 1}}$$
$$\underbrace{b_{20}, ........, b_2(\frac{n}{m} - 1)}_{\text{Group 2}}$$
$$\underbrace{b_{m0}, ........, b_m(\frac{n}{m} - 1))}_{\text{Group m}}$$

The n/m bits of each group are processed in parallel in a D/A converter (e.g. a charge distribution D/A converter). A following capacitive division restores the output voltages of the D/A group converters to their correct relationships. A correctly weighted output voltage of the Nth group $U_{AGN}$ is obtained from the unweighted $U_{AN}$ by $$U_{AGN} = \frac{U_{AN}}{\frac{n(m-N)}{2^m}}$$

(n:—number of bits per byte, m:—number of groups, N:—group number).

The summed output voltage is obtained by equalization of the charges. More particularly, capacitive division and charge equalization can be combined.

Figure 2:
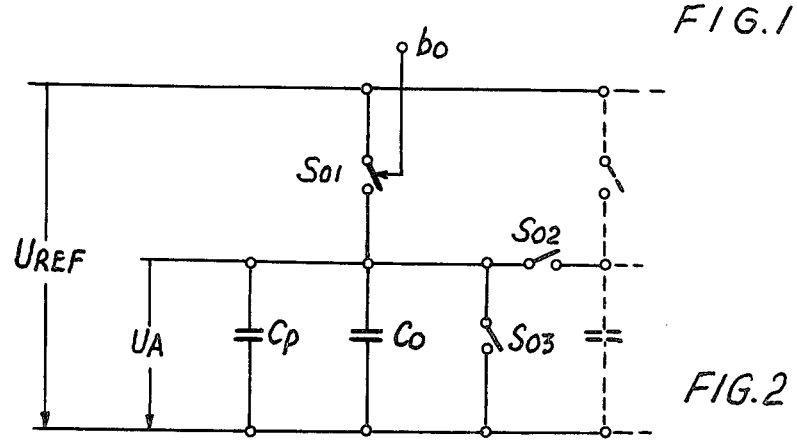
FIG. 2 is a D/A converter comprising charge equalization and division.

The capacitive division of the analog output signal is obtained by opening all the switches in the D/A converter (cf. FIG. 2) and connecting a capacitor $C_p$ of capacity $(2^P - 1) C_0$ in parallel to capacitor $C_0$ according to the equation $$U'_A = U_A \frac{C_0}{(2^P - 1) C_0 + C_0} \quad (1)$$
$$= \frac{U_A}{2^P}$$

Capacitive division may also be obtained by discharging all the capacitors of a group with the exception of $C_0$ and then distributing the charges of $C_0$ between the capacitors $C_1 ... C_{(n/m)-1}$ and an additional capacitor $C_0'$. The output voltage will then be $$U'_A = U_A \frac{C_0}{(2(\frac{n}{m}) - 2)C_0 + 2C_0} \quad (2)$$
$$= \frac{U_A}{2(\frac{n}{m})}$$

Figure 3:
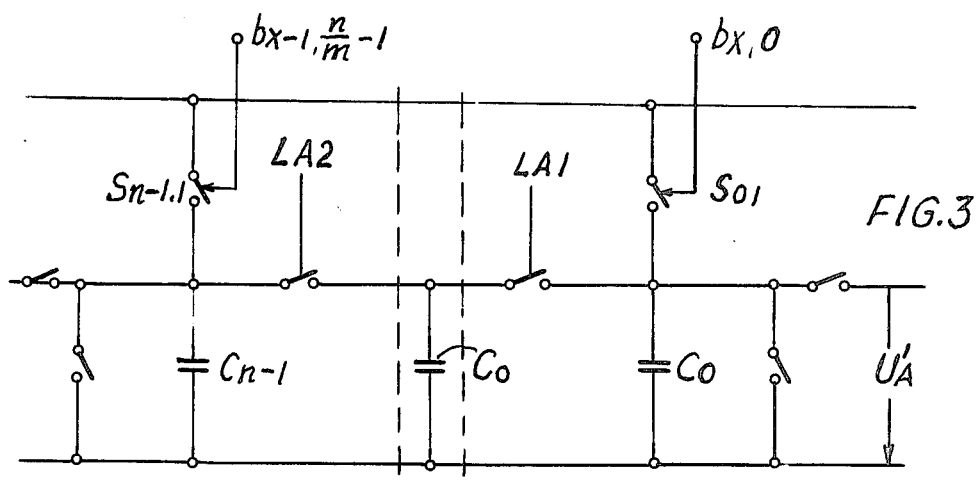
FIG. 3 is a modified converter comprising charge equalization and division.

The capacitive division and charge equalization between the groups can be performed jointly. For this purpose the output voltage of group $(x-1)$ according to method (1) is divided by 2 and charge equalization is effected between capacitor $C_0$ of group $(x-1)$ and $C_{(n/m)-1}$ of group x (cf. FIG. 3).

$$U_A' = \frac{\Sigma Q}{\Sigma C}$$
$$= \frac{2^{-1} U_{A(x-1)} C_0 + U_{A(x)} 2^{k-1} C_0}{(1 + 2^{k-1}) C_0} \quad \text{where } k = \frac{n}{m}$$
$$= \frac{U_{A(x-1)} + U_{A(x)} 2^k}{2 (1 + 2^{k-1})}$$
$$= \frac{[b_{(x-1),0} \cdot 2^0 + ... + b_{(x-1),k-1} \cdot 2^{k-1}] \cdot U_{REF}}{2 (2^k - 1) (1 + 2^{k-1})}$$

-continued
$$= \frac{[b_{(x),0} \cdot 2^k + ... + b_{(x),k-1} \cdot 2^{2k-1}] \cdot U_{REF}}{2 (2^k - 1) (1 + 2^{k-1})}$$

The processing time for the groupwise D/A conversion by charge distribution between binary weighted capacitors follows from the following relationships:

For the D/A conversion of each group two cycles are needed. The following capacitive division and charge equalization requires $2(m-1)$ cycles so that the conversion of n bits in m groups requires $2(m-1)+2$ cycles.

Optimization of the precision ranges is facilitated by group formation. In conventional D/A converters each bit of a digital word enters into the final result with a different degree of precision. For small D/A values this leads to relative imprecision which may be very considerable. By forming groups it is possible by a choice of the dimensions of the elements in the groups to ensure that the relative precision remains constant throughout the range or that it is particularly good in a desired range.

Compared with series D/A conversion the following advantages are secured:

Since the series conversion of n bits requires 2n cycles and the present method of conversion requires $2(m-1)+2$ cycles the overall conversion time is very substantially reduced. In the case of n=10 (10 bits) and m=2 (2 groups of 5 bits) 20 cycles are needed for a series; but only 4 cycles for a groupwise D/A conversion, i.e. the conversion rate is speeded up 5 times.

Compared with a pure parallel D/A conversion the following advantages are gained:

1. The expenditure in components is drastically cut. A parallel 10-bit conversion requires 4.1 mm² MOS capacitors, whereas the groupwise D/A conversion by charge distribution between binary weighted capacitors requires only 0.25 mm² although the precision is the same.

2. Relative and absolute precision can be optimized for particular intervals in the conversion range.

The advantages which are thus achieved enable a high speed D/A converter which needs little space despite high resolution to be monolithically integrated. This is the first time that integration of digital and analog elements in a MOS system has become possible.

The invention may be embodied in other specific forms without departing from the spirit or essential characteristics thereof. The embodiments are therefore to be considered in all respects as illustrative and not restrictive.

What we claim is:

1. A digital-to-analog converter consisting of capacitors for a weighted charge distribution corresponding to the digits of an n-digit binary number that is to be converted, comprising n weighted capacitors ($C_0, C_1, ..., C_{n-1}$) connected in parallel coupled with charging switches ($S_{01}, ..., S_{n-1,1}$) connected in parallel for the n digits ($b_0, b_1, ..., b_{n-1}$) of a binary number, discharging switches ($S_{03}, ..., S_{n-1,3}$) and charge distributing switches ($S_{02}, ..., S_{n-1,2}$) as well as a reference voltage source ($U_{REF}$) being also provided;

wherein said n bits of the digital number are divided into m groups (bytes) and each m group is converted in parallel within group but serially from group to group starting with the least significant bit first, and wherein the weighted output voltage $U_{AGN}$ by the Nth group is calculated from the unweighted voltage $U_{AN}$ by reference to the formula $$U_{AGN} = \frac{U_{AN}}{\frac{n(m-N)}{2^m}}$$

(n=number of bits per byte, m=number of groups, N=group number), and wherein the overall output voltage representing the analog of the converted binary number is obtained by charge equalization, and wherein the capacitive division of the analog output signal is effected by opening the switches of the converter and connecting an additional capacitor $C_p$ having a capacity $(2^P-1) C_0$, according to the formula $$U'_A = U_A \frac{C_0}{(2^p - 1)C_0 + C_0} = \frac{U_A}{2^p}$$

$(p = \frac{n(m-N)}{m})$.

2. A digital-to-analog converter as defined in claim 1 wherein a charge distribution takes place between the capacitors $C_0$ of the group $(x-1)$ and $C_{(n/m)-1}$ of the group x after a proper division of the output of group $(x-1)$.

3. A digital-to-analog converter, as defined in claim 1, comprising a single switching unit for capacitive division and charge equalization.

4. A digital-to-analog converter as defined in claim 1, wherein all the capacitors in a group are discharged with the exception of $C_0$ and the charges of $C_0$ are then distributed between the capacitors $C_1 \ldots, C_{(n/m)-1}$.

5. A digital-to-analog converter as defined in claim 4 wherein a charge distribution takes place between the capacitors $C_0$ of the group $(x-1)$ and $C_{(n/m)-1}$ of the group x after a proper division of the output of group $(x-1)$.

* * * * *